(12) United States Patent
Sheperek et al.

(10) Patent No.: US 11,003,383 B2
(45) Date of Patent: May 11, 2021

(54) ESTIMATION OF READ LEVEL THRESHOLDS USING A DATA STRUCTURE

(71) Applicant: Micron Technology, Inc., Boise, ID (US)

(72) Inventors: Michael Sheperek, Longmont, CO (US); Larry J. Koudele, Erie, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/514,588

(22) Filed: Jul. 17, 2019

(65) Prior Publication Data

US 2021/0019078 A1    Jan. 21, 2021

(51) Int. Cl.
*G11C 16/26* (2006.01)
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .................................................. G11C 11/5642
USPC .......................................................... 711/154
See application file for complete search history.

(56) References Cited

U.S. PATENT DOCUMENTS

| | | | | |
|---|---|---|---|---|
| 2013/0007343 A1* | 1/2013 | Rub | ..................... | G06F 12/0246 711/103 |
| 2014/0043903 A1* | 2/2014 | Ok | ........................ | G11C 29/028 365/185.03 |
| 2014/0359202 A1* | 12/2014 | Sun | ..................... | G11C 11/5642 711/103 |
| 2015/0039842 A1* | 2/2015 | Fitzpatrick | .............. | G06F 12/00 711/154 |

* cited by examiner

*Primary Examiner* — Min Huang
(74) *Attorney, Agent, or Firm* — Lowenstein Sandler LLP

(57) ABSTRACT

A data structure is generated that identifies a shape of a valley that is located between programming distributions of the memory component. The data structure identifies read level thresholds at the valley associated with a logical page type of the memory component. For each of the read level thresholds the data structure associates a respective error count. A read level threshold is estimated using the data structure. A read operation is performed at the memory component using the read level threshold identified using the data structure.

20 Claims, 9 Drawing Sheets

250

Generate a data structure that identifies a shape of a valley that is located between programming distributions of the memory component
255

Identify a read level threshold of the multiple read level thresholds using the data structure
260

Perform a read operation at the memory component using the read level threshold identified using the data structure
265

ESTIMATION OF READ LEVEL THRESHOLDS USING A DATA STRUCTURE

TECHNICAL FIELD

Embodiments of the disclosure relate generally to memory sub-systems, and more specifically, relate to the estimation of read level thresholds for a memory component of a memory sub-system using a data structure, such as a histogram.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The disclosure will be understood more fully from the detailed description given below and from the accompanying drawings of various embodiments of the disclosure.

FIG. 2B is a flow diagram of an example method for estimating a read level threshold using a data structure, in accordance with some embodiments of the disclosure.

DETAILED DESCRIPTION

Figure 1:
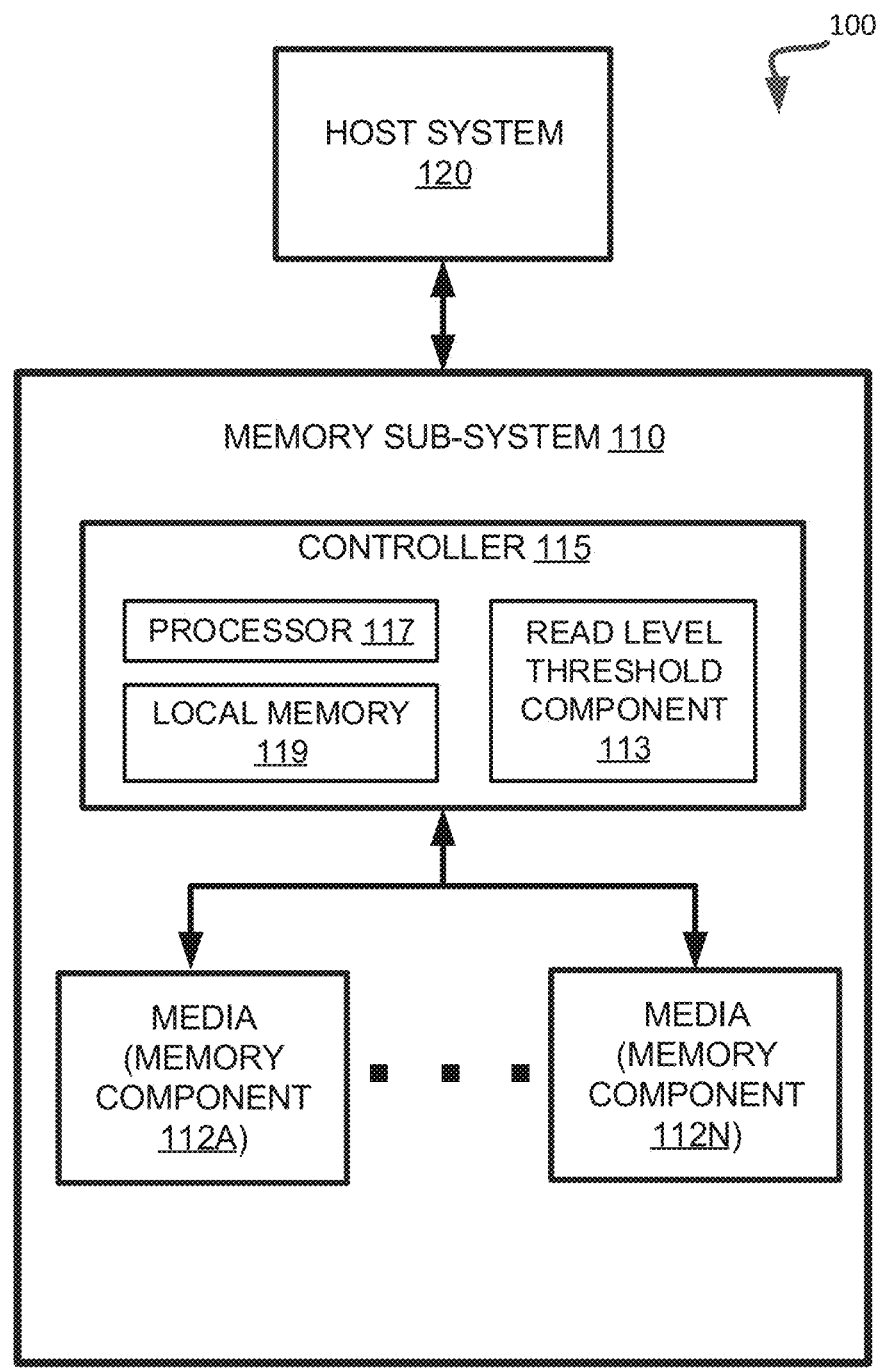
FIG. 1 illustrates an example computing environment that includes a memory sub-system in accordance with some embodiments of the disclosure.

Aspects of the present disclosure are directed to the estimation of read level thresholds for a memory component of a memory sub-system using data structures, such as histograms. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

A single-level cell (SLC) can store only one bit per memory element, whereas a multi-level cell (MLC) is a memory element that is capable of storing more than a single bit of information. It should be noted that the state of the memory cell can be programmed, and the state of the memory cell can be determined by comparing a read voltage of the memory cell against one or more read level thresholds. That is, with SLC NAND flash technology, each cell can exist in one of two logic states, storing one bit of information per cell. Whereas, MLC NAND flash memory has four or more possible logic states per cell, such that each MLC-based cell can store two bits of information per cell. The higher number of possible logic states reduces the amount of margin (e.g., valley margin or voltage range) separating the logic states. The memory device can include triple-level cell (TLC) memory. In TLC memory, the memory cell stores three bits of information per cell with eight total logic states. The memory device can include a quad-level cell (QLC) memory. In QLC memory, each memory cell can store four bits of information with sixteen logic states. For example, in a QLC memory, a memory cell can store four bits of data (e.g., 1111, 0000, 1101, etc.) corresponding to data received from the host system using the sixteen logic states. It can be noted that operations herein can be applied to any multi-bit memory cells.

Depending on the cell type, pages can be arranged into various logical portions (also referred to as "page types" herein), such as lower pages (LPs), upper pages (UPs), extra pages (XPs), and top pages (TPs). Each bit of the memory cell is stored at a different page portion of the memory cell. Various read level thresholds can be used for the various page types: SLC logical page types are lower logical pages (LPs), MLC logical page types are LPs and upper logical pages (UPs), TLC logical page types are LPs, UPs, and extra logical pages (XPs), and QLC logical page types are LPs, UPs, XPs and top logical pages (TPs). For example, a memory cell of the QLC memory can have a total of four logical pages, including a lower logical page (LP), an upper logical page (UP), an extra logical page (XP) and a top logical page (TP), where each logical page stores a bit of data. For example, a bit can be represented by each of the four logical pages of the memory cell. In a memory cell for QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

A program targeting (PT) operation controls the program verify (PV) target placement such that the programming distributions are placed in a beneficial arrangement. A PV target can refer to voltage value or trim value used to program a memory cell at a given level. The PV target can set a threshold voltage (Vt) (e.g., minimum voltage at which a memory cell turns on or is conductive) of the memory cell. A PV target is associated with a particular programming distribution. For example, multiple memory cells that are programmed at a particular PV target can have threshold voltages that are within the corresponding program distribution. The program distribution can illustrate the range of threshold voltages (e.g., normal distribution of threshold voltages) for memory cells programmed at a particular PV target.

Valleys can be located between pairs of adjacent programming distributions. A valley can refer to an area or a region between a pair of adjacent programming distributions. The relative width of a valley can be approximated by valley margin. Valley margin can refer to a relative width or relative margin between pairs of adjacent programming distributions. For example, valley margins associated with a particular logical page type can indicate the relative width between pairs of programming distributions associated with the particular logical page type. For instance, a first valley margin of an upper logical page (e.g., valley 2 that is between the $2^{nd}$ distribution (L1) and $3^{rd}$ distribution (L2)) that is larger than a second valley margin of the upper logical page (e.g., valley 6 that is between the $6^{th}$ distribution (L5) and the $7^{th}$ distribution (L6)) can indicate that the first valley is larger than the second valley (e.g., valley 2 is large than valley 3), but does not explicitly recite the absolute width or absolute size of either valley. Valley margin can be correlated with read window budget (RWB). Read window budget can refer to an absolute measurement in volts (e.g., millivolts (mV)) between two adjacent programming distributions. For example, the RWB for valley 2 can be 270 mV and the RWB for valley 6 can be 250 mV. If, for example, the first valley margin is larger than the second valley margin, then a correlation that the RWB of the first valley margin is larger than the RWB of the second valley margin can be made.

A read level threshold register can store a value that indicates the read level threshold voltage (also referred to as "read level threshold" herein) for a particular valley of a particular logical page type. The read level threshold can be a voltage value that is within the valley between a pair of adjacent programming distributions. The read level threshold can be used to read data from the memory cell. A trim can refer to a digital value that is used for a circuit, such as a register, that is converted into an analog voltage value. For example, the read level threshold trims can be programmed into a trim register, which produces a read level threshold voltage used to read data from a memory cell.

In some conventional memory sub-systems, manufacturing default read level thresholds are used to read data from the memory components. The manufacturing default read level thresholds are not adjusted during the life of the conventional memory sub-system. Programming distributions can shift over the life of memory sub-system, and using manufacturing default read level thresholds throughout the life of the memory sub-system can cause an increase of errors over time, and shorten the useful life of memory sub-system.

In some conventional memory sub-systems, manufacturing default read level thresholds can be changed during the life of a memory sub-system. For example, a valley between a pair of adjacent programming distributions can be swept (e.g., read) at many voltages to obtain many data samples. The data samples can be stored. When enough data samples have been collected, the conventional memory sub-system can use the data samples to determine a read level threshold associated with the particular valley that is to be used to perform a read operation at a memory component. It can take significant time to determine a read level threshold by sweeping the voltages between a pair of adjacent distributions. It can take significant resources (e.g., storage resources) to store the read samples. In some instance, the determined read level threshold of a conventional memory sub-system can be non-ideal (e.g., cause read errors), which can also shorten the useful life of the conventional memory sub-system.

Aspects of the disclosure address the above challenges by performing one or more sampling operations at one or more read level thresholds associated with a valley. Read samples are obtained from the one or more sampling operations. The read samples are used to determine an error count associated with respective ones of the read level thresholds. The error counts and read level thresholds are used to generate a data structure, such as a histogram, and the data structure is used to estimate a read level threshold that is used to perform a read operation at the memory component. In some embodiments, the minimum value of the data structure is estimated. The minimum value is associated with a read level threshold that is used to perform a read operation at the memory component.

FIG. 1 illustrates an example computing environment 100 that includes a memory sub-system 110 in accordance with some embodiments of the disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, word lines, word line groups (e.g., multiple word lines in a group), or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (e.g., processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the disclosure, a memory sub-system 110 cannot include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a read level threshold component 113 that performs operations as described herein. In some embodiments, the read level threshold component 113 can be part of host system 120, controller 115, memory component 112A-112N, an operating system, or an application. Read level threshold component 113 can accumulate read samples from a valley located between programming distributions and generate a data structure, such as a histogram, to estimate a valley center and select a read level threshold at which to perform a read operation at the memory component 112A-112N. For example, the controller 115 can include a processor 117 (processing device) configured to execute instructions stored in local memory 119 for performing the operations described herein.

Figure 2A:
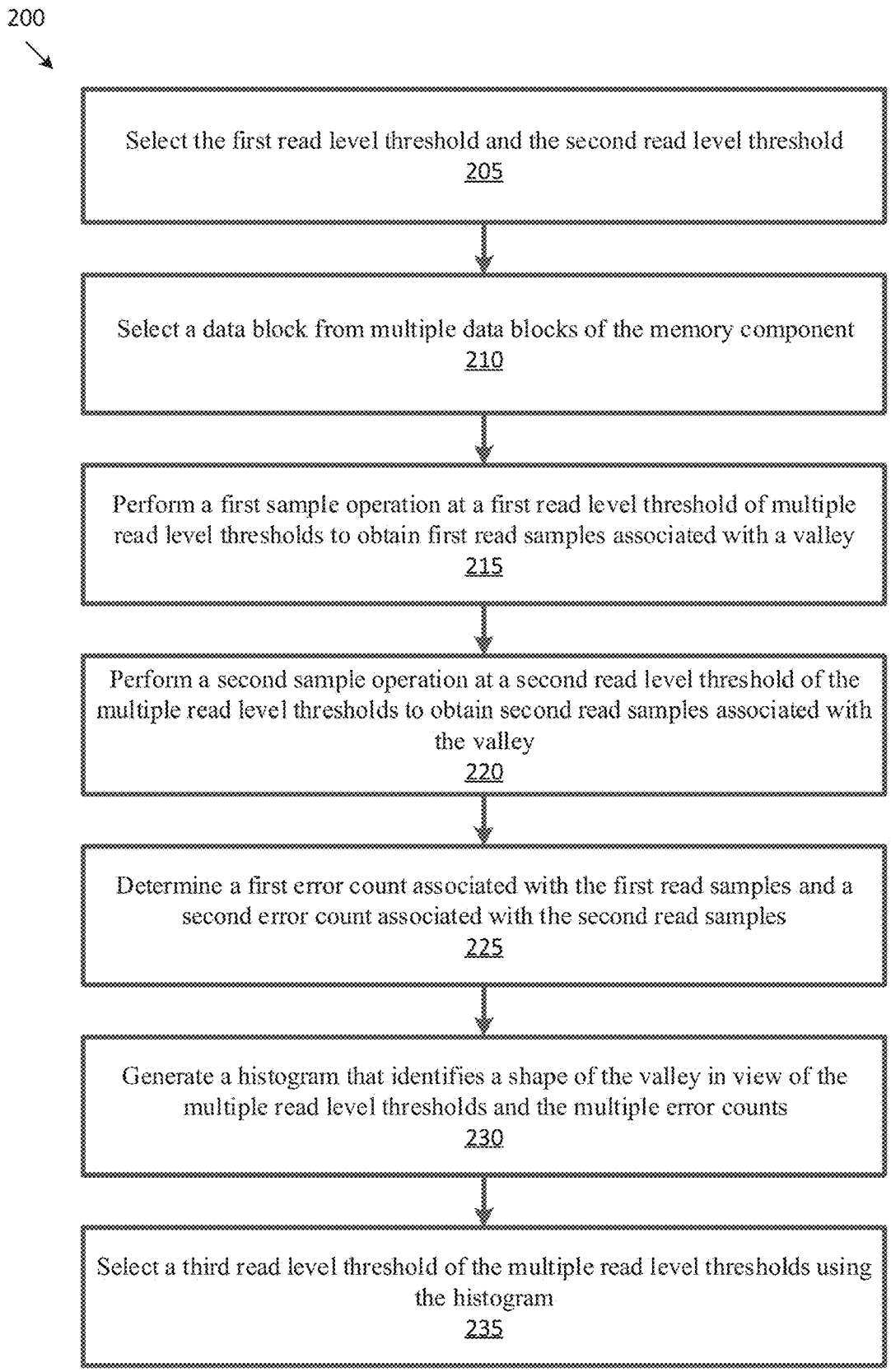
FIG. 2A is a flow diagram of an example method for estimating a read level threshold using a histogram, in accordance with some embodiments of the disclosure.

FIG. 2A and FIG. 2B illustrate method 200 and method 250, respectively. The method 200 or method 250 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 200 or method 250 is performed by the read level threshold component 113 of FIG. 1. Although shown in a particular order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment. Other operations flows are possible. In some embodiments, different operations can be used. It can be noted that aspects of the present disclosure can be used for any type of multi-bit memory cells.

In some embodiments, a read level threshold associated with a particular valley can be selected from among multiple read level thresholds associated with a particular valley. In some embodiments, the read level threshold can be selected randomly from the multiple read level threshold associated with a particular valley. A data block on which the sampling operation is to be performed can also be selected. In some embodiments, the data block can be selected randomly from the multiple data blocks associated with a memory component. A data block can refer to a unit of memory. In some embodiments, a data block can include multiple data units. A data unit can refer to the smallest unit of data of the memory component that can be written. In some embodiments, a data block can refer to the smallest unit of memory that can be erased.

The selected read level threshold can be the voltage level at which the sampling operation is performed. In some embodiments, the sampling operation can be performed using one or more read level thresholds. The sampling operation strobes (e.g., reads or strobe reads) the particular valley for the entire data block using the selected read threshold to collect read samples. For instance, the read sample can indicate a digital value of either "0" or "1." The read samples can be compared to an expected value. If a read sample is different than the expected value, a bit error for the selected read level threshold is determined. The bit errors for can be counted for the read samples associated with the selected read level threshold. An error count (also referred to as "bit error count" herein) can indicate a number of bit errors associated with a particular read level threshold. In some embodiments, the selected read level threshold and associated error count can be used to generate a data structure that identifies a shape of the valley. A data structure can refer to one or more of a collection of data values, relationships among the data values, or the operations that can or are be applied to the data values. In some embodiments, the data structure identifies a frequency of bit errors (e.g., error count) for one or more read level thresholds for a particular valley of a logical page type. For example, subsequent to determining an error count for the selected read level threshold, the data structure can be generated that associates the selected read level threshold with a particular error count. As additional sampling operations are performed at different read level thresholds, the data structure can be updated to associate the different read level thresholds with respective error counts.

In some embodiments, the data structure is (or includes) a histogram. A histogram can refer to a particular data structure having particular characteristics. The characteristics of the histogram can relate or associated error count with read level threshold. In some embodiments, each read level threshold has a bin and each bin represents the error count (e.g., frequency of bit errors) for a particular read level threshold. In some embodiments, the error count can be normalized such that a comparison between bins associated with different read level thresholds can be usefully compared. A histogram as described herein refers to the above described data structure. A histogram can also be used to create a visual representation (e.g., graph) of the data structure of the histogram.

In some embodiments, the data structure, such as a histogram, can be used to estimate a read level threshold that can be used to perform a read operation (for the particular valley) at the memory component.

It can be advantageous to keep each read level threshold centered within a valley so that the memory component can achieve the best overall bit error rate (BER) possible. BER can refer to a ratio of a number of bits in error of a data vector divided by a total number of bits for the given data vector. A memory cell (or data block, word line group (WLG), or memory component, etc.) that is calibrated or converged has a read level threshold that results in a lowest BER. BER can correspond to a particular logical page type. For example, a particular logical page type has a particular BER and another logical page type has another BER. Error count associated with a read level threshold of a particular valley can be correlated with BER. For example, a read level threshold that has a higher error count and that is associated with a particular valley will contribute more to the BER of the logical page type than another read level threshold that has a lower error count and that is associated with the same valley.

In some embodiments, to estimate the read level threshold that is to be used to perform a read operation at the memory component, a minimum value associated with the data structure, such as the histogram, can be estimated. The minimum value of the data structure can estimate a read level threshold that is associated with the lowest error count or have the lowest BER.

In some embodiments, an estimator type can be selected from multiple estimator types in view of a condition associated with the data structure. An estimator type can estimate a minimum value of the data structure. In some embodiments, the condition indicates a shape type of the valley. In some embodiments, an occurrence of an event causes the data structure to be reset to an initial state.

Estimating read level thresholds using data structures, as described herein, can allow for the estimation of read level thresholds that have the lowest error count or lowest BER, which improves data integrity and operation of a memory sub-system. Estimating the read level threshold using the data structures as described herein can allow for the estimation of a read level threshold using fewer sampling operations and fewer read samples than conventional memory sub-systems, which allows for the estimation of the read level threshold to occur more quickly and to be performed with fewer computational resources than conventional memory sub-systems. For example, read samples from a minority of read level thresholds associated with a valley can be used to accurately estimate a read level threshold having the lowest BER. Estimating the read level threshold using the data structures as described herein can also decrease the amount of storage resources used to estimate a read level threshold. For example, the data structure can keep track of error counts associated with different read level thresholds, which makes the storing of the individual read samples optional.

It can be noted that for purposes of illustration, rather than limitation, a data structure is used to estimate a read level threshold for a particular valley. In some embodiments, aspects of the disclosure can be used estimate read level thresholds for one or more of the valleys of one or more of the logical page types of the memory component.

In operational mode (e.g., when in operation in the field), aspects of the disclosure can be run dynamically to extend the usable lifetime of the memory components of the memory sub-system. The term "dynamic" as used herein can refer to processes, functions, operations, or implementations that occur during operation, usage, or deployment of a corresponding device, system, memory sub-system, or embodiment, and after or while running the manufacturer's or third-party firmware. The dynamically occurring processes, functions, operations, or implementations can occur after or subsequent to design, manufacture, and initial testing, setup or configuration (e.g., after test mode).

FIG. 2A is a flow diagram of an example method for estimating a read level threshold using a histogram, in accordance with some embodiments of the disclosure. For purposes of illustration, rather than limitation, method 200 describes estimating a read level threshold for a particular valley. Aspects of the disclosure can be applied to one or more valleys of one or more logical page types. For instance, aspects of the disclosure can be applied to estimate all the read level thresholds for all the valleys of a multi-bit memory component.

At operation 205, processing logic performing method 200 selects the first read level threshold and the second read level threshold. In some embodiments, the first read level threshold and the read level threshold are selected from multiple read level threshold that are associated with a valley. The multiple read thresholds associated with the valley are the read level threshold located between the pair of programming distributions associated with the valley. In some embodiments, processing logic can select one or more read level thresholds at which to perform a sample operation.

In some embodiments, processing logic can select three read level thresholds: 1) a center value, 2) a negative offset value (e.g., the center value less the negative offset), and 3) a positive offset value (e.g., the center value plus the positive offset).

For example, the processing logic can select a first read level threshold, such as the center value. The center value can be a read level threshold that is centered (at least previously centered) at the lowest point in the valley. In some embodiments, the center value can be a default read level threshold. In some embodiments, the center value can be the previous read level threshold that was estimated to be the lowest point in the valley (e.g., best BER). In some embodiments, processing logic can select a second read level threshold that is offset to one side of the center value (e.g., to the right of the center value—positive offset). Processing logic can select a third read level threshold that is offset to the opposite side of the center value (e.g., to the left of the center value—negative offset). In some embodiments, the negative offset and the positive offset are selected to be offset by the same magnitude with respect to the center value. In some embodiments, the negative offset or the positive offset are selected randomly from a set of read level thresholds that are associated with a particular valley. In some embodiments, one or more of the selected read level thresholds are selected randomly.

A randomly selected object can be selected using a random value generator. A random value generator can generate or select one or more values, such as numbers or symbols that cannot reasonably be predicted by better than by random chance. A random value generator can generate or select any one value (e.g., read level threshold) from a range of possible values with equal probability. It can be noted that in some embodiments, a random value can include also a pseudo-random value. A pseudo-random value is a generated or selected value whose properties approximate the properties of random values. It can be noted that random as described herein can refer to a random or pseudo-random, unless otherwise described.

In some embodiments, processing logic can select one or more of the read level thresholds randomly from a set of read level thresholds associated with the valley. For example, the set of real level thresholds associated with the valley can be a range of voltage values associated with a particular valley, such as 2.0 Volts to 2.5 Volts (V). A voltage within the range of [2.0-2.5V] can be selected randomly and used as a read threshold voltage.

At operation 210, processing logic selects a data block from multiple data blocks of the memory component. In some embodiments, the sample operation is performed on the selected data block.

In some embodiments, to select the data block from multiple data blocks of the memory component, processing logic performs a random selection of the data block from the multiple data blocks of the memory component. For example, the memory component can include multiple data blocks (e.g., pool of data blocks), and processing logic can select a random data block form the pool of data blocks.

At operation 215, processing logic performs a first sample operation at a first read level threshold of multiple read level thresholds to obtain first read samples associated with a valley. In some embodiments, the valley is located between adjacent programming distributions of the memory component. For example, in TLC memory valley 2 is located between the second distribution (L1) and the third distribution (L2).

For example, a sample operation can perform a strobe (also referred to as a "strobe read" or "read") at the selected data block. The strobe is performed at the particular read level threshold to read and obtain read samples for a particular valley associated with particular logical page type. The data block includes multiple instances of the logical page type and multiple instances of the particular valley. The strobe can return multiple read samples of the instances of the particular valley. In some instances, the read samples are either a bit value of "0" or a bit value of "1."

At operation 220, processing logic performs a second sample operation at a second read level threshold of the multiple read level thresholds to obtain second read samples associated with the valley. In embodiments, the second read level threshold is different than the first read level threshold.

At operation 225, processing logic can determine a first error count associated with the first read samples and a second error count associated with the second read samples. In some embodiments, the first error count indicates a number of bit errors among the first read samples of the first sample operation at the first read level threshold. The second error count indicates a number of bit errors among the second read samples of the second sample operation at the second read level threshold.

For example and as noted above, the read samples are either a bit value of "0" or a bit value of "1." The bit values of the read samples can be compared to an expected value. If the bit value of the read samples are not equal to the expected value, a bit error is determined. The bit error is added to the error count. For instance, a 1000 read samples for a particular valley of a data block are collected from a sample operation. If 100 of the read samples are bit errors, the error count is 100.

At operation 230, processing logic generates a histogram that identifies a shape of the valley in view of the multiple read level thresholds and the multiple error counts. In some embodiments, the histogram identifies the multiple read level thresholds of the valley that is associated with a logical page type of a plurality of logical page types of the memory component. For each of the multiple read level thresholds the histogram associates a corresponding one of the multiple error counts.

At operation 235, processing logic estimates a third read level threshold of the multiple read level thresholds using the histogram. In some embodiments, the third read level threshold is used to perform a read operation at the memory component.

In some embodiments, to estimate a third read level threshold of the multiple read level thresholds using the histogram, processing logic can determine a minimum value of the histogram. In some embodiments, minimum value indicates the third read level threshold is associated with a lowest error count among the multiple error counts of the histogram. In some embodiments, the estimated minimum value can be a read level threshold that has not be sampled as part of a sample operation.

In some embodiments, to estimate a third read level threshold of the multiple read level thresholds using the histogram, processing logic can select an estimator type from multiple estimator types in view of a condition associated with the histogram. The minimum value of the histogram is determined using the selected estimator type. The condition can include a shape type of the valley. Some example estimator types include minimum value of the histogram, minimum value of a function that fits a shape of the histogram, or vectorization. Additional details of selecting an estimator type is further described with respect to FIG. 5C.

In some embodiments, subsequent to estimating the third read level threshold, processing logic can perform a read operation at the memory component using the third read level threshold. For example, processing logic can set a read level trim to a digital value that corresponds to the third read level threshold, and perform a read operation using the read level trim to read data at the memory component.

In some embodiments, processing logic can determine that an occurrence of an event associated with the histogram. Responsive to determining the occurrence of the event associated with the histogram, processing logic can reset the histogram to an initial state. The initial state can include resetting the values of the histogram to zero such that all the bins of the histogram are empty. Examples of events can include, but are not limited to, meeting or exceeding a time threshold, meeting or exceeding a read operation threshold (e.g., number of read operations performed at a data block or memory component), meeting or exceeding a number of bit errors from a read operation, and so forth.

FIG. 2B is a flow diagram of an example method for estimating a read level threshold using a data structure, in accordance with some embodiments of the disclosure. For purposes of illustration, rather than limitation, method 250 describes estimating a read level threshold for a particular valley. Aspects of the disclosure can be applied to one or more valleys of one or more logical page types. For instance, aspects of the disclosure can be applied to estimate all the read level thresholds for all the valleys of one or more logical page types of a multi-bit memory component. It can also be noted that operations of method 200 can also be used in conjunction with operations described with respect to FIG. 2A.

In some embodiments, processing logic can perform a first sample operation at a first read level threshold of the multiple read level thresholds to obtain first read samples at the valley. Processing logic can perform a second sample operation at a second read level threshold of the multiple read level thresholds to obtain second read samples at the valley. Processing logic can determine a first error count associated with the first read samples and a second error count associated with the second read samples. The error counts include the first error count and the second error count. The first error count, the first read level threshold, the second error count, and the second read level threshold can be used to generate the data structure.

At operation 255, processing logic generates a data structure that identifies a shape of a valley that is located between programming distributions of the memory component. In some embodiments, the data structure identifies multiple read level thresholds at the valley associated with a logical page type of multiple logical page types of the memory component. In some embodiments, for each of the multiple read level thresholds the data structure associates a respective error count of the multiple error counts.

In some embodiments, each of the multiple error counts indicate a number of bit errors from the read samples of a sample operation at a respective read level threshold of the multiple read level thresholds At operation 260, processing logic estimates a read level threshold of the multiple read level thresholds using the data structure.

In some embodiments, to estimate a read level threshold of the multiple read level thresholds using the data structure, processing logic can determine a minimum value of the data structure. In some embodiments, the minimum value estimates the read level threshold having a lowest error count among the multiple error counts of the data structure.

In some embodiments, to estimates a read level threshold of the multiple read level thresholds using the data structure, processing logic can select an estimator type from multiple estimator types in view of a condition associated with the data structure. The minimum value of the data structure is determined using the selected estimator type.

At operation 265, processing logic performs a read operation at the memory component using the read level threshold identified using the data structure. In some embodiments, the data structure is a histogram.

Figures 3A, 3B:
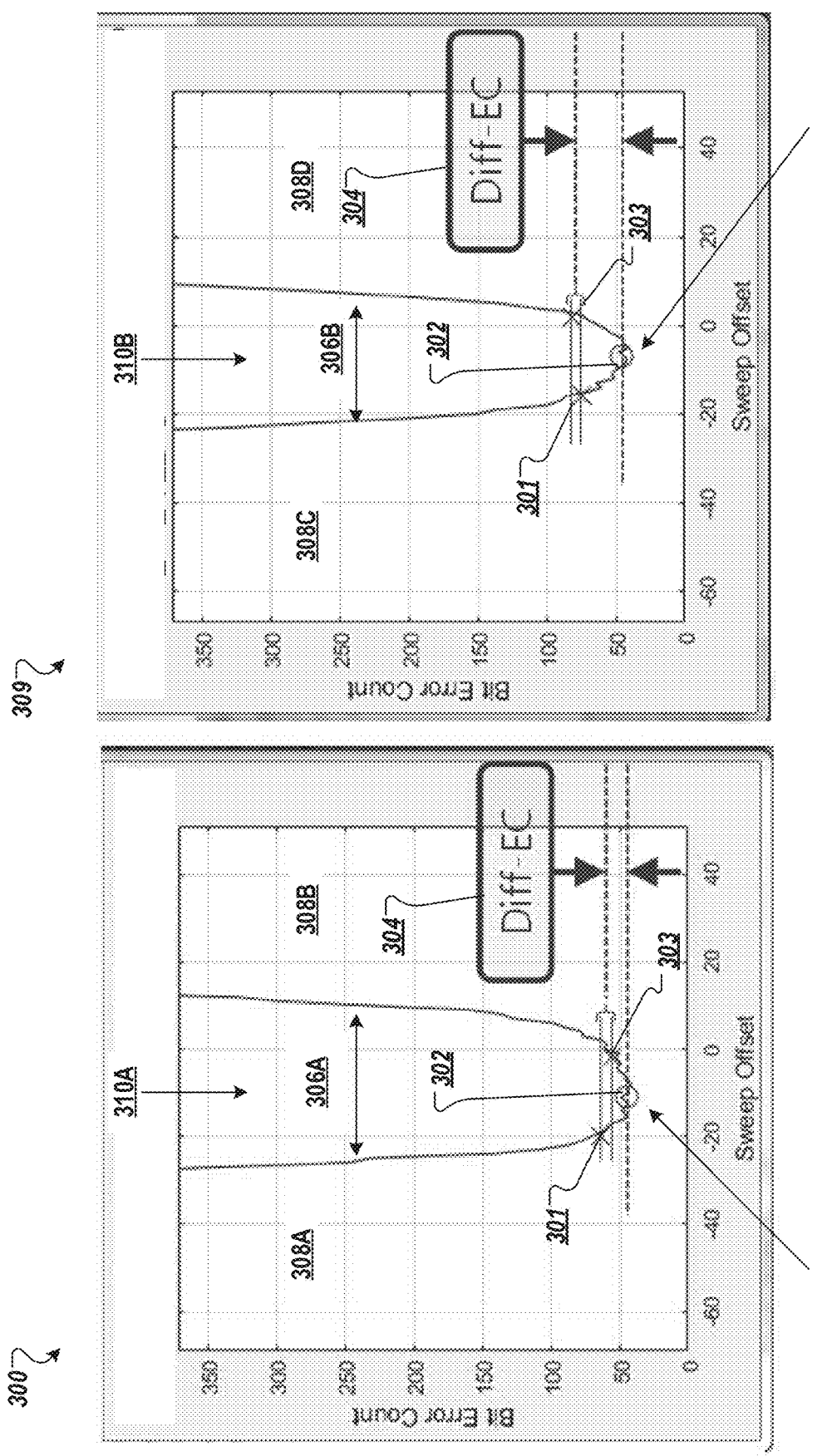
FIGS. 3A-3B illustrate two read level thresholds between two adjacent program distributions, in accordance with some embodiments of the disclosure.

FIGS. 3A-3B illustrate examples of two read level thresholds between two adjacent program distributions, in accordance with some embodiments of the disclosure. Graph 300 shows a valley 310A between a pair of adjacent programming distributions 308A and 308B. Valley 310A-B can refer to the area between two adjacent distributions. Valley margin 306A is also shown between programming distributions 308A and 308B. Graph 309 shows a valley 310B between a pair of adjacent programming distributions 308C and 308D. Valley margin 306B is also shown between programming distributions 308C and 308D. Valley margin 306A-B can refer to a relative width or relative margin between pairs of adjacent programming distributions. One or more of programming distributions 308A-308D are generally referred to as "programming distribution(s) 308" herein. One or more of valley margins 306A-306B are generally referred to as "valley margin(s) 306" herein. One or more of valleys 310A-310B are generally referred to as "valley(s) 310" herein.

In embodiments, the read level threshold component 113 performs a sample operation that samples each logical page type in one or more data blocks. Each sample can include 3 reads: low-sample 301, center-sample 302, and high-sample 303. The read level threshold component 113 calibrates or converges by obtaining a center value (e.g., read level threshold) that results in a lowest bit error rate (BER) for a particular logical page type. Convergence is when a read level trim (e.g., the digital value the represents the read level threshold voltage) has the value that returns the fewest number of page or code word errors or bit errors. This is what is called the calibrated or centered value and results in the lowest BER. In some embodiments, in addition to finding the center of the valley 310, the read level threshold component 113 calibrates or converges by balancing the side samples (low-sample 301 and high-sample 303) so that that the low-sample 301 and the high-sample 303 are equal in magnitude for a particular valley and the other valleys associated with a particular logical page type. In some embodiments, the low-sample 301 and the high-sample 303 are equal in magnitude for all the valleys for all the logical page types (or for multiple logical page types). In some embodiments, the low-sample 301 and the high-sample 303 are equal in magnitude for at least some valleys of a particular logical page type. Graph 300 and graph 309 show examples of calibrated valleys with the center-samples 302 being balanced between the side samples (e.g., the 4 side samples in both graph 300 and 309 are roughly equal in magnitude). Graph 309 demonstrates wide valley behavior and graph 309 demonstrates narrow valley behavior. During sampling and updating, when the read level trims (e.g., trim registers) are centered, the value of the trim will start "dithering." Anytime a read level trim changes direction (increasing the trim value, then decreasing the trim value, and vice versa) is considered a dither. This action of dithering indicates the trim is centered. Read level threshold 320A and 320B point to a read level threshold that is centered and at the lowest point in a respective valley 310A and 310B In embodiments, the center-samples 302 are used as feedback metrics by PT to equalize the LP/UP/XP error rates by moving PV targets slightly. For instance, the read level threshold component 113 operation also obtains the center bit error count (CenterEC) by determining the error count for the center-samples of each read level trim. The CenterEC of a logical page type can be used to determine BER for a particular logical page type. For instance, BER can include a ratio of the CenterEC for a logical page type to the total number of bits sampled with respect to the particular logical page type. The PT operation can perform BER leveling by moving PV targets such that the CenterECs between logical page types are balanced (e.g., balancing). For example, the CenterECs between different logical page types can be roughly the same, such that the BER between the logical page types are balanced.

In some embodiments, in addition to center-samples 302 valley margin is also used to equalize the BER between the logical page types (LP/UP/XP). Within each logical page type, the respective valley margin(s) can also be controlled to have a reasonable match (e.g., be similar widths). The default PV targets can determine the depths of the valleys 310 between the program distributions 308, the depths being related to valley margin 306 of each valley 310. To determine the valley margin 306 of a program distribution 308, the read level threshold component 113 can determine values of a metric that is indicative of the width (or depth) between adjacent pairs of programming distributions 308. In some embodiments, the metric is a difference error and values of the metric are difference error counts (Diff-EC) (also referred to as "Diff-EC measurement(s)" herein). The difference error can be inversely proportional to the valley margins. For example, as illustrated the Diff-EC of graph 300 is smaller than the Diff-EC of graph 309, and valley margin 306A of graph 300 is larger than valley margin 306B of graph 309. The read level threshold component 113 can determine the Diff-EC measurements 304. The Diff-EC measurements 304 can be used to identify relative valley margins. The Diff-EC measurements 304 can be the mean of the two side samples 301, 303 minus the center-sample 302. The PT operation can perform BER leveling by moving PV targets to match not only the CenterECs between logical page types (e.g., balancing), but also match the valley margins within each logical page type (or within all the logical page types) (e.g., equalizing). It can also be noted that valley margin can be correlated to valley depth (e.g., from peak to trough between program distributions). For example, a deep valley can correlate to a narrower valley margin as compared to a shallow valley (e.g., less deep valley) that correlates to a wider valley margin. It can be noted that a balanced BER causes the RWB to gravitate (e.g., equalize) to a value where the RWB for valleys of a particular logical page type are approximately the same, which occurs as a natural byproduct of the PT operation.

It can also be noted that the center-sample error count can be the CenterEC of the center-samples 302 (e.g., vertical axis of graph 300 and 309). Despite the center-sample error counts balancing, the valley margin (or depth) can be dramatically different even within the valleys of different logical page types (UP & XP). To determine which valley has the largest valley margin or the smallest valley margin, the measure of Diff-EC can be reliably used. The higher the Diff-EC measurement 304, the narrower the valley margin (or the RWB is smaller). The offsets between the low-sample 301, center-sample 302, and high-sample 303 for different Diff-EC measurements 304 are equal for purposes of comparison.

Figure 4:
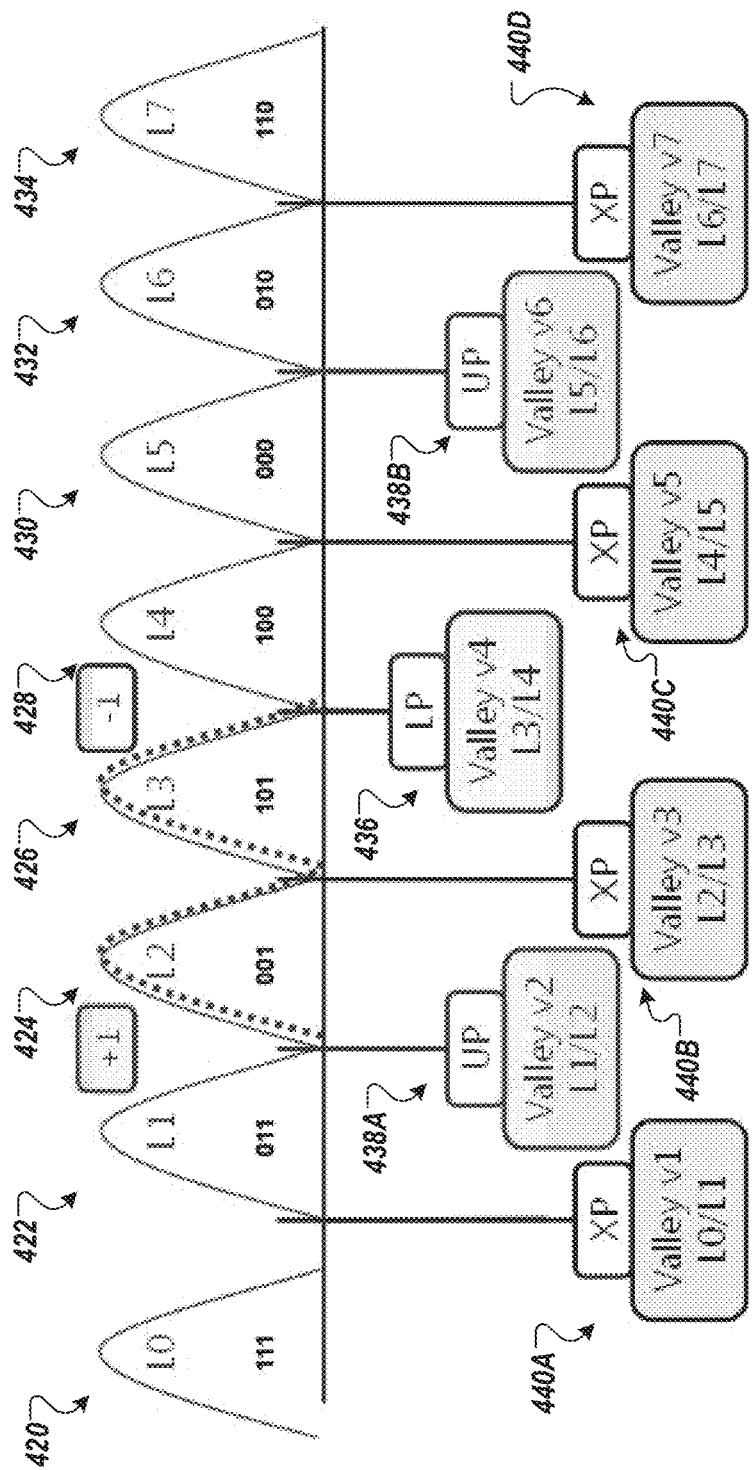
FIG. 4 illustrates eight programming distributions, including two programming distributions after at least two of PV targets are adjusted according to a PT operation, in accordance with some embodiments of the disclosure.

FIG. 4 illustrates eight programming distributions, including two programming distributions after at least two of PV targets are adjusted according to a PT operation, in accordance with some embodiments of the disclosure.

The PT operation calibrates multiple logical page types such that the BER of each logical page type will be approximately the same through the life of the memory system and through all operating environments (e.g., minimizes BER). Additionally, the PT operation calibrates each particular logical page type to equalize the widths of valleys of each particular logical page type such that the RWBs for the valleys of each particular logical page type are approximately the same. For example, the PT operation can adjust the three TLC logical page types; lower logical page (LP), upper logical page (UP), and extra logical page (XP) such that the BER of each of these three logical page types will be approximately the same (i.e., balanced). The PT operation uses the data from the read level threshold component 113 as the feedback metric in a closed loop feedback system.

The PT operation, in addition to balancing logical page type BER, keeps the BER of each logical page type balanced dynamically by performing the PT operation during block programming, such as between the first programming pass and the second programming pass of a multi-pass programming operation on a block. Balancing the BER can reduce the average error correction trigger rate throughout the life of each die, including end-of-life (EOL) conditions. By adjusting PV targets, PT effectively moves the program distributions in the direction of the adjusted PV targets. PT calibration (e.g., adjusting the PV targets) can result in equalization of valley margins of a particular logical page type so that the valley margins are converged at a particular convergence value and the valley margins for a particular page type are roughly the same. PT calibration can also include balancing the BER of each logical page type so that each valley associated with a particular logical page has roughly similar RWB.

The PT operation can increase endurance (i.e., more total Program/Erase cycles) for each die in a memory system. Using the PT operation, no one logical page type will dominate the end of life criteria. The PT operation can be performed independently for each word line group. The PV targets of the memory component can start with manufacturing default PV targets. The PT operation can be run during a test mode so that all PV targets of all word line groups (WLGs) of all dies in the memory system have been balanced (i.e., when the BERs of the logical page types are approximately the same).

As illustrated in FIG. 4, most of the data in each block is stored as TLC information, including 3 bits per cell. This is accomplished using eight programming distributions 420-434. A lower logical page (LP) is defined with one read level threshold 436 (e.g., approximately at the center between programming distributions 426 and 428). An upper logical page (UP) is defined with two read level thresholds 438A and 438B (generally referred to as "read level threshold(s) 438" herein). An extra logical page (XP) is defined with fourth read level thresholds 440A-440D (generally referred to as "read level threshold(s) 440" herein). The eight programming distributions 420-434 each correspond to a level (L0:L7), each level corresponding to a code (000:111). Between each pair of eight programming distributions 420-434 is a valley, totaling seven valleys (v1:v7). A center or peak of each programming distribution 420-434 corresponds to a PV target for the respective programming distribution 420-432. In total, there can be eight PV targets for a 3-bit representation. In some embodiments, the first programming distribution 420, corresponding to the first level L0, has a fixed PV target. In some embodiments, the second programming distribution 422, corresponding to the second level L1, has fixed PV target. In some embodiments, the last programming distribution 434, corresponding to the eighth level L7, can have a fixed PV target. In some embodiments, one or more of the first programming distribution 420, corresponding to the first level L0, the second programming distribution 422, corresponding to the second level L1, and the eighth programming distribution 434, corresponding to the eight level L7, have fixed PV targets. It can be noted that FIG. 4 illustrates increasing voltage levels from right to left. For example, the programming distribution 420 has the lowest voltage level and is associated with the lowest PV target, and programming distribution 422 has the second lowest voltage level and the second lowest PV target. Programming distribution 434 has the highest voltage level and the highest PV target.

In the depicted embodiment, the PT operation starts with each PV target in a default state as defined by factory settings. In some embodiments, one or more of the first PV target of the initial program distribution (L0), the second PV target of the second program distribution (L1) and the last PV target of the last program distribution (L7) can be fixed, allowing the intervening PV targets to be adjusted. For example, with eight PV targets (of L0-L7), the L0, L1, and L7 PV targets are fixed and the other PV targets L2 through L6 can receive characterized starting values. Alternatively, the L0, and L7 PV targets are fixed and the other PV targets L1-L6 can be adjusted. As noted above, by adjusting PV targets, PT effectively moves the program distributions in the direction of the adjusted PV targets. PT calibration (e.g., adjusting the PV targets) can result in valley margins of a particular logical page type to converge at a particular convergence value so that the valley margins for a particular logical page type are roughly the same. PT calibration can include balancing the BER of each logical page type so that each logical page type has roughly similar BER and roughly similar CenterEC. During PT PV target adjustment, when that value of the PV trim starts "dithering" (anytime a PV trim changes direction (increasing the trim value, then decreasing the trim value, and vice versa) is considered a dither), the PT operation for the respective program distribution has converged.

A program target offset is defined as the difference in position of a PV distribution relative to the default starting value. For example, the PV targets for L2 and L3 first slew to the right by a certain amount (e.g., by about 130 mv) and then stop slewing and start dithering, which is stabilization (or calibrated). The valley after L3 is the L3/L4 valley (v4), the center value of which is the read level threshold 436 (corresponding to the LP Read Level). This movement is caused by balancing the BER of the LP page with respect to other logical pages. All PV targets can be stabilized after a number of P/E cycles (e.g., ~40 P/E cycles). It can take some time to stabilize the PV targets as the operation alternates between LP/UP and LP/XP adjustments with a maximum movement of 1 click (e.g., 10 mv). It is possible to characterize these offsets in many die, producing a head start set of offsets, providing balanced BER at time zero.

In some embodiments to balance the BER, some of the RWB of a logical page type that has a lower BER will be given to a different logical page type with a higher BER. In particular, the margin of a valley (having the highest valley margin of the valleys of the logical page type) of the logical page type that has the lower BER will be decreased, and the margin of the valley (having the lowest valley margin of the valleys of a different logical page type) of a different logical page type that has the higher BER will be increased (e.g., net-zero adjustment). By balancing the BER across logical page types of a WLG, the BERs across the multiple logical page types are approximately the same, and the CenterEC across the multiple logical page types are approximately the same, and the page margins across the multiple logical page types are approximately the same.

In embodiments, the eight programming distributions 420, 422, 424, 426, 428, 430, 432, and 434 each correspond to a level (L0:L7), each level corresponding to a code (000:111). In some embodiments, the code represents gray code. Gray code refers to a binary numeral system were two successive valleys differ in only one bit (e.g., binary digit). It can be noted that in other embodiments, a different gray code can be used.

Figure 5A:
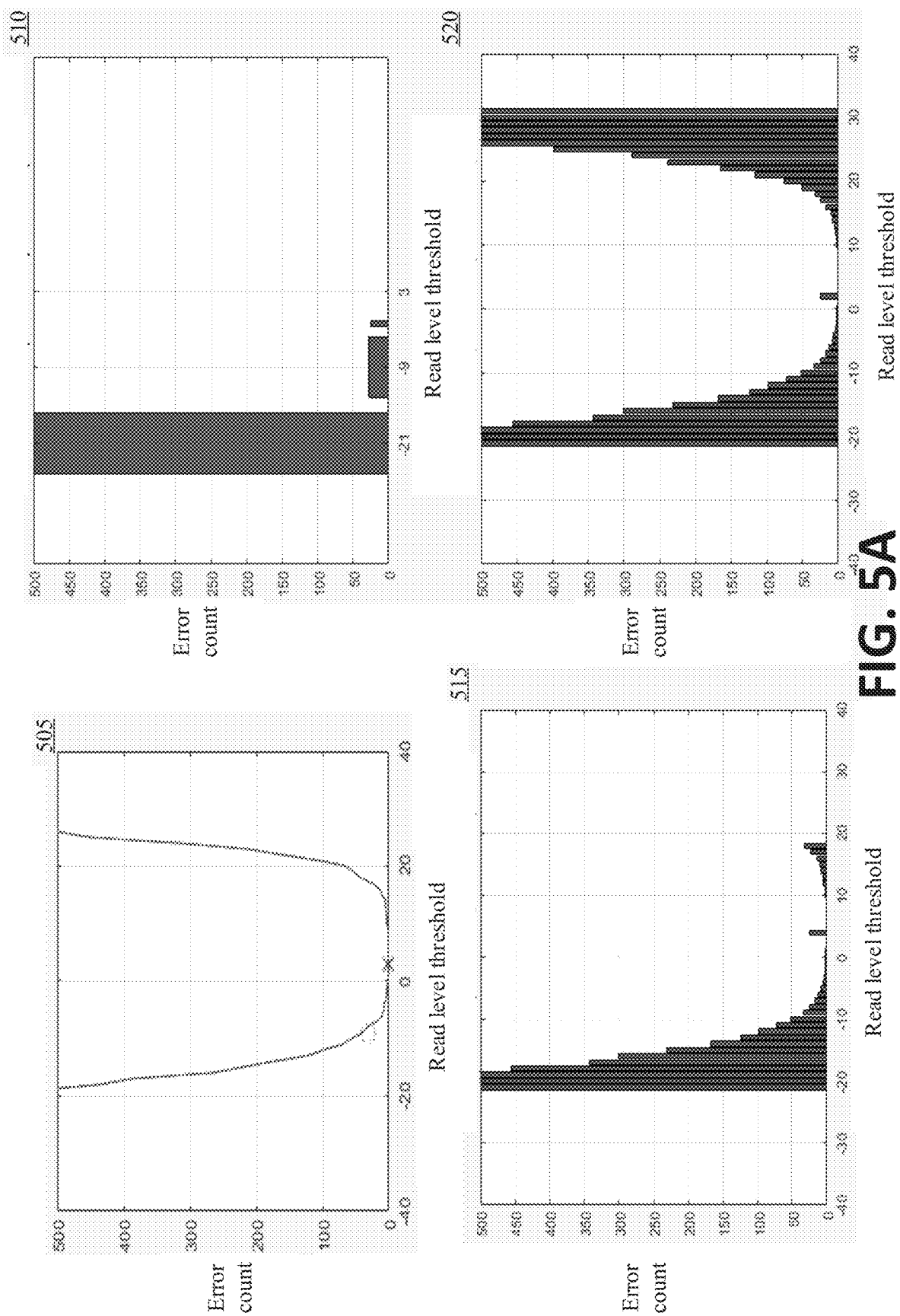
FIG. 5A illustrates graphs showing histograms that estimate a shape of a valley associated with a logical page type, in accordance with embodiments of the disclosure.

FIG. 5A illustrates graphs showing histograms that estimate a shape of a valley associated with a logical page type, in accordance with embodiments of the disclosure. Graph 505, 510, 515, and 520 illustrate graphs of the shape of a particular valley. The vertical axis of graph 505, 510, 515, and 520 illustrates error count. The error count increases from bottom to top. The horizontal axis of graph 505, 510, 515, and 520 illustrates read level thresholds. The read level thresholds increase from left to right. The horizontal axis is illustrated with a center value, "0," and offset values that are offset from the center value. In an illustrative example, the offset values are millivolts from the center value. For example, if the center value "0" represents read level threshold of 2.0 Volts (V), the offset of 20 represents a read level threshold of 2.02 V, and the offset of −20 represents a read level threshold of 1.98 V. In other example, the horizontal axis can be represented as absolute read level thresholds, such as 1.98V, 2.0V 2.02V, and so forth.

In some embodiments, graph 505 can be a representation of the actual shape of a valley, rather than an estimate. For example, each read threshold level in a set of read level thresholds associated with the valley is swept and plotted in graph 505. Graph 505 is provided as a reference to help explain graph 510, 515, and 520. It can be noted that the valley illustrated in graph 505, 510, 515, and 520 has a particular valley shape type, such as parabolic shape (e.g., bathtub).

At graph 510, read level threshold component 113 selects one or more read level thresholds at which to perform sampling operations(s). Read level threshold component 113 selects a data block from multiple data blocks of the memory component. The read level threshold component 113 can perform the sampling operation(s) at the selected data block. As noted above, the sampling operation reads data at selected data block at a particular read level threshold. The read level threshold is associated with a particular valley. The sampling operation collects read samples and determines whether the read samples return the expected value or do not return the expected value. If a read samples does not return the expected value, the read sample is counted as a bit error and added to the error count.

In the current example, two read level thresholds have been selected, −9 offset and −21 offset. Read level threshold component 113 performs a sample operation at the first read level threshold (e.g., −9 offset) and another sample operation at the second read level threshold (e.g., −21 offset). It can be noted that in some embodiments, read level threshold component 113 can sample the data block at one or more read level thresholds in a single sample operation. The sample operation can return read samples associated with each read level threshold. The read samples associated with the first read level threshold (e.g., −9 offset) include 30 bit errors from N read samples. The error count for the first read level threshold is 30. The read samples associated with the second read level threshold (e.g., −21 offset) includes 500 bit errors from N read samples. The error count for the second read level threshold is 500.

Graph 510 represents a visual illustration of a histogram. The histogram identifies multiple read level thresholds associated with a valley of a particular logical page type. For each of the read level thresholds, the histogram associates a frequency of an error count.

In some embodiments, the histogram can have multiple bins. The bins divide a range of values into a set of intervals. In the current example, the intervals or bins represent different read level thresholds. For instance, each interval or bin can represent 1 millivolt. It can be noted that the bins can represent any interval. Each bin records the count of values (e.g., error count) that fall within each respective interval. In the current example, 30 bit errors (e.g., error count of 30) are associated with the bin for the first threshold value (e.g., −9 offset or 1.991V) and 500 bit errors (e.g., error count of 500) are associated with the bin for the second threshold value (e.g., −21 offset or 1.979V). "Bin" used as a verb can refer to the applying the sample data or the error count to the respective interval (e.g., bin) of the histogram.

It can be noted that estimating a read level threshold at which to perform a read operation can be performed using the histogram as illustrated in graph 510. The estimated read level threshold is illustrated by the small rectangle to the right of the bin associated with −9 offset. As noted above, the estimated real level threshold is the read level threshold that is estimated to be at the lowest point in the valley or the read level threshold that has the lowest BER. Estimating the read level threshold is further described with respect to FIG. 5C.

Graph 515 illustrates the same histogram as graph 510 but with additional data points. For example, graph 515 illustrates the histogram after performing 48 sample operations. For each sample operation, one or more read level thresholds can be selected. In some embodiments, the same data block is sampled for each of the sample operations. In other embodiments, different data blocks can be selected for one or more of the sample operations. After each sample operation, read level threshold component 113 collects the read samples, determines the error count for each read level threshold, and bins the data (e.g., associates the particular read level threshold with the respective error count).

In embodiments, the read level threshold at which to perform a read operation can be estimated using the histogram as illustrated in graph 515. The estimated read level threshold is illustrated by the tallest rectangle located between 0 and 10 at the horizontal axis. It can be noted that with the additional read samples the estimated read level threshold has shifted.

In some embodiments, the error count associated with a bin can be normalized. Normalization can refer to adjusting the values (e.g., error counts) to allow for or facilitate more relevant or useful comparison to corresponding normalized values. Normalization can also refer to taking a property of the data structure (e.g., histogram) and making it equal to 1. For example, the sample operations can be performed at the same read level threshold multiple times. If for example, a sample operation is performed once at a particular read level threshold and 10 times at another read level threshold and the error counts were added cumulatively, the bin associated with the first read level threshold that was sampled once may not yield a useful comparison to the bin associated with the second read level threshold that was sampled 10 times. In some embodiments, normalization of the error count can include taking an average of the error counts on a per sample operation (e.g. per strobe) basis. For example, if two read operation are performed at the same read level threshold and the first read operation determines 400 bit errors and the second read operation determines 200 bit errors, the error count can be normalized by taking the average error count of the two sample operations (e.g., error count of 300).

Graph 520 illustrates the same histogram as graph 510 and 515 but with additional data points. For example, graph 520 illustrates the histogram after performing 78 sample operations. After each sample operation, read level threshold component 113 collects the read samples, determines the error count for each read level threshold, and bins the data (e.g., associates the particular read level threshold with the respective error count).

In embodiments, the read level threshold at which to perform a read operation can be estimated using the histogram as illustrated in graph 520. The estimated read level threshold is illustrated by the tallest rectangle located between 0 and 10 at the horizontal axis. It can be noted that with additional read samples the estimated read level threshold has shifted.

Figure 5B:
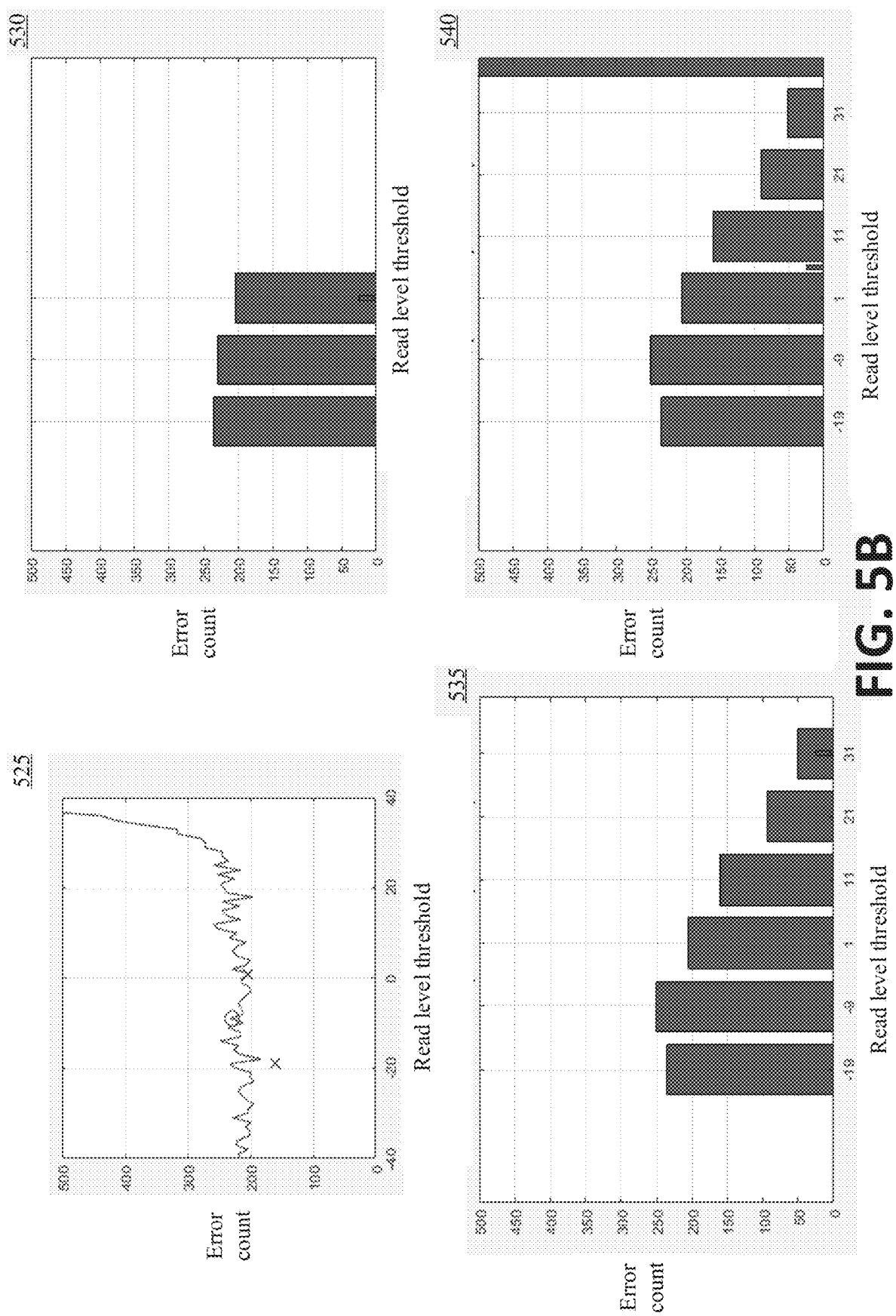
FIG. 5B illustrates graphs showing histograms that estimate another shape of a valley associated with a logical page type, in accordance with embodiments of the disclosure.

FIG. 5B illustrates graphs showing histograms that estimate another shape of a valley associated with a logical page type, in accordance with embodiments of the disclosure. Graph 525, 530, 535, and 540 illustrate graphs of the shape of a particular valley. The vertical axis of graph 525, 530, 535, and 540 illustrates error count. The error count increases from bottom to top. The horizontal axis of graph 525, 530, 535, and 540 illustrates read level thresholds. The read level thresholds increase from left to right. The horizontal axis is illustrated with a center value, "0," and offset values that are offset from the center value. In an illustrative example, the offset values are millivolts from the center value. In other example, the horizontal axis can be represented as absolute read level thresholds. Aspects described herein, an in particular with respect to FIG. 5A, can be applied to FIG. 5B.

In some embodiments, graph 525 can be representation of the actual shape of a valley, rather than an estimate. For example, each read threshold level in a set of read level thresholds associated with the valley is swept and plotted in graph 525. Graph 525 is provided as a reference to help explain graph 530, 535, and 540. It can be noted that the valley illustrated in graph 525, 530, 535, and 540 has a particular valley shape type, such as half-parabolic shape (e.g., half bathtub).

At graph 530, read level threshold component 113 selects one or more read level thresholds at which to perform a sampling operations(s). Read level threshold component 113 selects a data block from multiple data blocks of the memory component. The read level threshold component 113 can perform the sampling operation(s) at the selected data block. As noted above, the sampling operation reads data at selected data block at a particular read level threshold. The read level threshold is associated with a particular valley. The sampling operation collects read samples and determines whether the read samples return the expected value or do not return the expected value. If a read samples does not return the expected value, the read sample is counted as a bit error and added to the error count.

In the current example, three read level thresholds have been selected, −19 offset and −9 offset and 1 offset (e.g., 1.981V, 1.991V, and 2.001V respectively). Read level threshold component 113 performs a sample operation at the first read level threshold (e.g., −19 offset), another sample operation at the second read level threshold (e.g., −9 offset), and still another sample operation at the third read level threshold (e.g., 1 offset). It can be noted that in some embodiments, read level threshold component 113 can sample the data block at one or more read level thresholds in a single sample operation. The sample operations return read samples associated with each read level threshold. The read samples associated with the first read level threshold (e.g., −19 offset) include 240 bit errors from N read samples. The error count for the first read level threshold is 240. The read samples associated with the second read level threshold (e.g., −9 offset) includes 230 bit errors from N read samples. The error count for the second read level threshold is 230. The read samples associated with the third read level threshold (e.g., 1 offset) includes 200 bit errors from N read samples. The error count for the third read level threshold is 200.

It can be noted that a read level threshold at which to perform a read operation can be estimated using the histogram as illustrated in graph 530. The estimated read level threshold is illustrated by the small rectangle inside the bin associated with 1 offset. Estimating the read level threshold is further described with respect to FIG. 5C.

Graph 535 illustrates the same histogram as graph 530 but with additional data points. For example, graph 535 illustrates the histogram after performing 4 sample operations. For each sample operation, one or more read level thresholds can be selected. In some embodiments, the same data block is sampled for each of the sample operations. In other embodiments, different data blocks can be selected for one or more of the sample operations. After each sample operation, read level threshold component 113 collects the read samples, determines the error count for each read level threshold, and bins the data (e.g., associates the particular read level threshold with the respective error count).

In some embodiments, the read level threshold at which to perform a read operation can be estimated using the histogram as illustrated in graph 535. The estimated read level threshold is illustrated by the small rectangle within the bin associated with 1 offset. It can be noted that with the additional read samples the estimated read level threshold has shifted.

Graph 540 illustrates the same histogram as graph 530 and 535 but with additional data points. For example, graph 540 illustrates the histogram after performing 5 sample operations. After each sample operation, read level threshold component 113 collects the read samples, determines the error count for each read level threshold, and bins the data (e.g., associates the particular read level threshold with the respective error count).

In some embodiments, the read level threshold at which to perform a read operation can be estimated using the histogram as illustrated in graph 540. The estimated read level threshold is illustrated by the rectangle located between 1 and 11 at the horizontal axis. It can be noted that with additional read samples the estimated read level threshold has shifted. It can be noted that the valley illustrated in graphs 525, 530, 535, and 540 has a particular valley shape, such as half-parabolic shape (e.g., half bathtub).

Figure 5C:
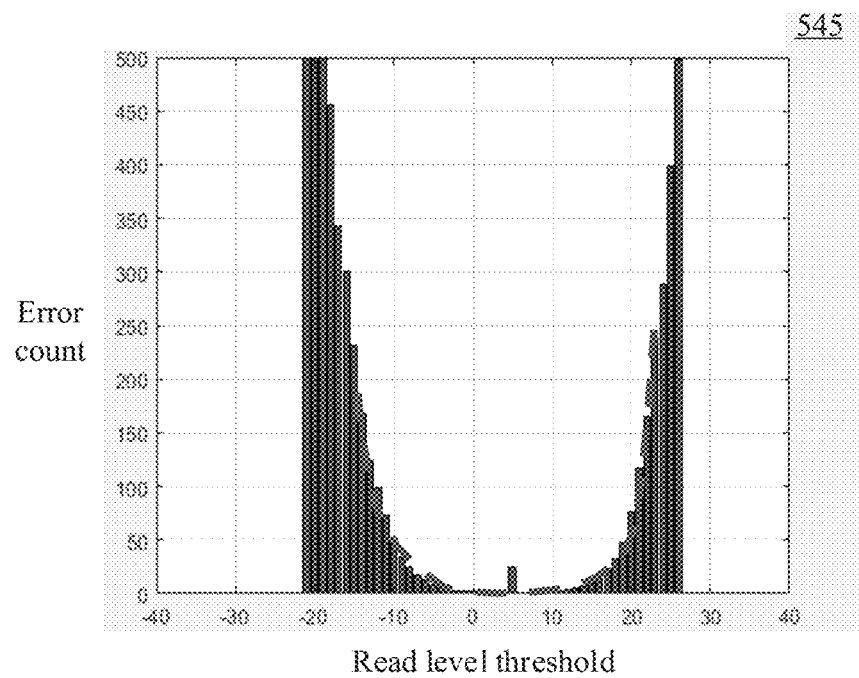
FIG. 5C illustrates graphs of a data structure that use different estimator types, in accordance with embodiments of the disclosure.
Figure 5C:
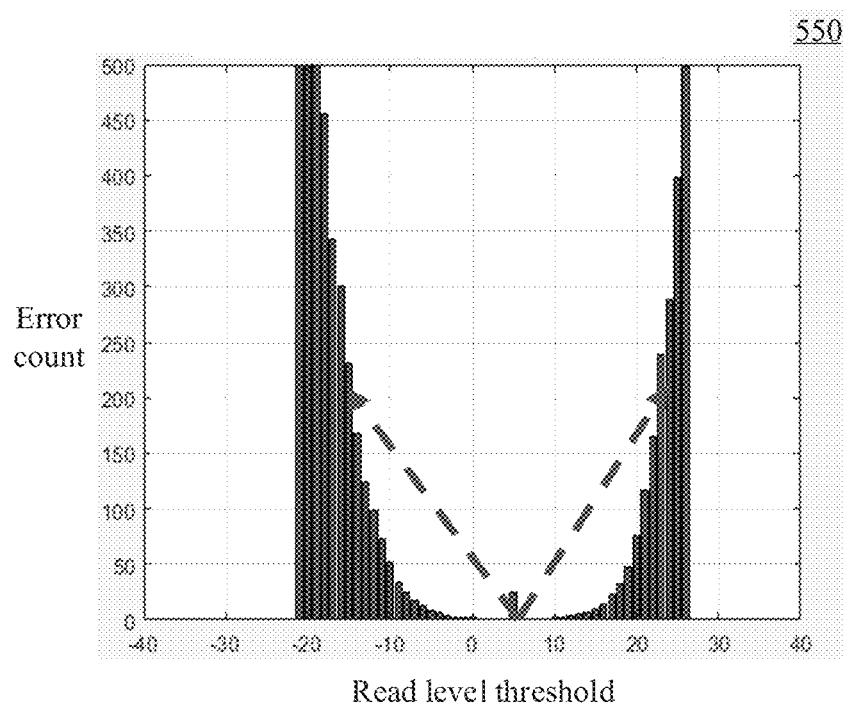

FIG. 5C illustrates graphs showing graphs of a data structure and use of different estimator types, in accordance with embodiments of the disclosure. Graph 545 and 550 illustrate histogram graphs of a valley having a parabolic shape. The vertical axis of graph 545 and 550 illustrates error count. The error count increases from bottom to top. The horizontal axis of graph 545 and 550 illustrates read level thresholds. The read level thresholds increase from left to right. The horizontal axis is illustrated with a center read level threshold, "0," and offset values that are offset from the center read level threshold. In an illustrative example, the offset values are millivolts from the center read level threshold. In other example, the horizontal axis can be represented as absolute read level thresholds.

In some embodiments, read level threshold component 113 can be used to estimate a minimum value of the data structure, such as a histogram. The minimum value can identify a read level threshold that is used to perform subsequent read operations of the memory component. In some embodiments, the minimum value of the data structure can identify a read level threshold among the read level threshold associated with a particular valley that is estimated to have the lowest BER. The minimum value can be an estimate of the center of the valley or the lowest point in the valley.

In some embodiments, one or more estimator types can be used to determine the minimum value of the data structure. An estimator type can refer to a process or operation that estimates a minimum value of the data structure. In some embodiments, the estimator type can include one or more of a minimum value estimator, a minimum value estimator of a fitted curve, or a vectorization estimator. It can be noted that the estimator types described herein are provided for illustration, rather than limitation.

In embodiments, the minimum value estimator identifies the minimum value directly from the data structure. For example, the minimum value estimator can sort the data structure from lowest to highest error count, and select the read level threshold that is associated with the lowest error count of the data structure.

In some embodiments, the minimum value estimator of a fitted curve can determine a function that best estimates the shape of the valley using the data structure (e.g., curve fitting), and determine the minimum value of the fitted curve. For example, graph 545 shows an illustration of finding the minimum value using the minimum value estimator of a fitted curve. The fitted curve can be represented by an estimated curve function such as $p1*x^2+p2*x+p3$. Read level threshold component 113 can find the minimum value of the fitted curve. The minimum value of the fitted curve can be used to identify the read level threshold that is to be used to perform a subsequent read operation. The minimum value estimated using the minimum value estimator of a fitted curve is represented by the tallest rectangle located between 0 and 10 of the horizontal axis.

In some embodiment, the vectorization estimator can generate two lines using data of the data structure. The vectorization estimator can generate two or more lines using the data of the data structure. The intersection of the two or more lines identify the minimum value of the data structure. The minimum value identified by the vectorization estimator can further identify the read level threshold that is to be used to perform a read operation. For example, graph 550 shows the graph of the same data structure as illustrated in graph 545. Graph, 550 shows an illustration of finding the minimum value using the vectorization estimator. The dashed lines show the generation of two lines using data values of the data structure. The two lines are illustrated as intersecting at approximately 5 offset, which identifies the minimum value of the data structure.

In some embodiments, read level threshold component 113 can select from among multiple estimator types in view of a condition associated with the data structure. One or more conditions can be used to determine which of the estimator types is to be used to determine a minimum value associated with the data structure. In some embodiments, the condition can include shape type of the valley. For example, if the shape type of the valley is a half-parabolic shape a vectorization estimator can be more suitable in determining the minimum value. In another example, if the shape type of the valley is a parabolic shape, the minimum value estimator of a fitted curve can be selected. In some embodiments, the condition can include memory resources available. For example, if the memory resources available to perform the estimation of the minimum value exceeds a threshold, read level threshold component 113 can select a first estimator type (e.g., minimum value estimator of a fitted curve). If the memory available to perform the estimation of the minimum value does not exceed a threshold, read level threshold component 113 can select a second estimator type (e.g., minimum value estimator). It can be noted that the conditions are provide as illustration, rather than limitation and that other conditions (e.g., number of read level thresholds sampled) can be used to select the estimator type. It can also be noted that one or more conditions can be used to select an estimator type from multiple estimator types.

Figure 6:
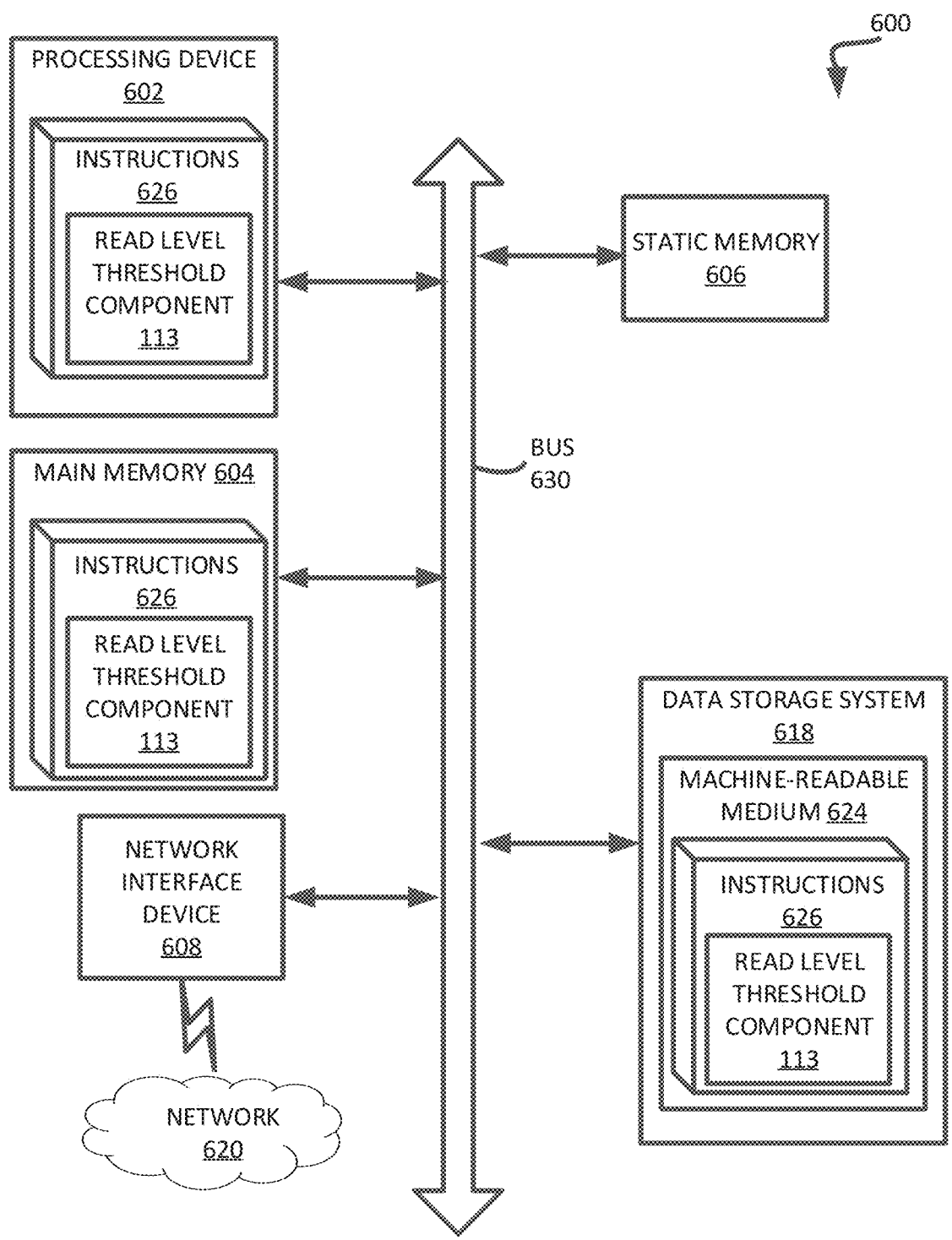
FIG. 6 illustrates an example machine of a computer system within which a set of instructions, for causing the machine to perform any one or more of the operations discussed herein, can be executed.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the read level threshold component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a non-transitory computer-readable storage medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the read level threshold component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled with the memory component, to:
perform a first sample operation at a first read level threshold of a plurality of read level thresholds to obtain first read samples associated with a valley that is located between programming distributions of the memory component;
perform a second sample operation at a second read level threshold of the plurality of read level thresholds to obtain second read samples associated with the valley;
determine a first error count associated with the first read samples and a second error count associated with the second read samples, wherein a plurality of error counts comprise the first error count and the second error count;
generate a histogram that identifies a shape of the valley in view of the plurality of read level thresholds and the plurality of error counts;
select an estimator type from a plurality of estimator types in view of a condition associated with the histogram; and
estimate a third read level threshold of the plurality of read level thresholds using the selected estimator type, wherein the third read level threshold is used to perform a read operation at the memory component.

2. The system of claim 1, wherein the histogram identifies the plurality of read level thresholds at the valley that is associated with a logical page type of a plurality of logical page types of the memory component, and for each of the plurality of read level thresholds the histogram associates a corresponding one of the plurality of error counts.

3. The system of claim 1, wherein to estimate the third read level threshold of the plurality of read level thresholds using the histogram, the processing device is to:

determine a minimum value of the histogram, wherein the minimum value indicates the third read level threshold associated with a lowest error count among the plurality of error counts of the histogram.

4. The system of claim 3,
wherein the minimum value of the histogram is determined using the selected estimator type, wherein the condition comprises a shape type of the valley.

5. The system of claim 1, the processing device further is to:
perform the read operation at the memory component using the third read level threshold.

6. The system of claim 1, wherein the first error count indicates a number of bit errors among the first read samples of the first sample operation at the first read level threshold, and wherein the second error count indicates a number of bit errors among the second read samples of the second sample operation at the second read level threshold.

7. The system of claim 1, the processing device is to:
select the first read level threshold and the second read level threshold from the plurality of read level thresholds associated with the valley; and
select a data block from a plurality of data blocks of the memory component, wherein the first sample operation and the second sample operation is performed at the data block.

8. The system of claim 7, wherein to select the data block from the plurality of data blocks of the memory component the processing device further is to:
perform a random selection of the data block from the plurality of data blocks of the memory component.

9. The system of claim 1, the processing device further is to:
determine an occurrence of an event associated with the histogram; and
responsive to determining the occurrence of the event associated with the histogram, reset the histogram to an initial state.

10. A system comprising:
a memory component; and
a processing device, operatively coupled with the memory component, to:
generate a data structure that identifies a shape of a region that is located between programming distributions of the memory component, wherein the data structure identifies a plurality of read level thresholds at the region associated with a logical page type of a plurality of logical page types of the memory component, and for each of the plurality of read level thresholds the data structure associates a respective error count of a plurality of error counts;
select an estimator type from a plurality of estimator types in view of a condition associated with the data structure;
estimate a read level threshold of the plurality of read level thresholds using the selected estimator type; and
perform a read operation at the memory component using the read level threshold identified using the data structure.

11. The system of claim 10, the processing device further is to:
perform a first sample operation at a first read level threshold of the plurality of read level thresholds to obtain first read samples at the region;
perform a second sample operation at a second read level threshold of the plurality of read level thresholds to obtain second read samples at the region; and
determine a first error count associated with the first read samples and a second error count associated with the second read samples, wherein the plurality of error counts comprise the first error count and the second error count, wherein the first error count, the first read level threshold, the second error count, and the second read level threshold are used to generate the data structure.

12. The system of claim 10, wherein to estimate the read level threshold of the plurality of read level thresholds using the data structure, the processing device is to:
determine a minimum value of the data structure, wherein the minimum value indicates the read level threshold associated with a lowest error count among the plurality of error counts of the data structure.

13. The system of claim 12,
wherein the minimum value of the data structure is determined using the selected estimator type.

14. The system of claim 10, wherein the each of the plurality of error counts indicate a number of bit errors among read samples of a sample operation at a respective read level threshold of the plurality of read level thresholds.

15. A method comprising:
performing a first sample operation at a first read level threshold of a plurality of read level thresholds to obtain first read samples associated with a valley that is located between programming distributions of a memory component;
performing a second sample operation at a second read level threshold of the plurality of read level thresholds to obtain second read samples associated with the valley;
determining a first error count associated with the first read samples and a second error count associated with the second read samples, wherein a plurality of error counts comprise the first error count and the second error count;
generating a histogram that identifies a shape of the valley in view of the plurality of read level thresholds and the plurality of error counts;
selecting an estimator type from a plurality of estimator types in view of a condition associated with the histogram; and
estimating a third read level threshold of the plurality of read level thresholds using the selected estimator type, wherein the third read level threshold is used to perform a read operation at the memory component.

16. The method of claim 15, wherein the histogram identifies the plurality of read level thresholds at the valley that is associated with a logical page type of a plurality of logical page types of the memory component, and for each of the plurality of read level thresholds the histogram associates a corresponding one of the plurality of error counts.

17. The method of claim 15, wherein estimating the third read level threshold of the plurality of read level thresholds using the histogram, the method comprising:
determining a minimum value of the histogram, wherein the minimum value estimates the third read level threshold associated with a lowest error count among the plurality of error counts of the histogram.

18. The method of claim 15, wherein the first error count indicates a number of bit errors among the first read samples of the first sample operation at the first read level threshold, and wherein the second error count indicates a number of bit errors among the second read samples of the second sample operation at the second read level threshold.

19. The method of claim 15, further comprising:
  selecting the first read level threshold and the second read level threshold from the plurality of read level thresholds associated with the valley; and
  selecting a data block from a plurality of data blocks of the memory component, wherein the first sample operation and the second sample operation is performed at the data block.

20. The method of claim 19, wherein selecting the data block from the plurality of data blocks of the memory component, the method further comprising:
  performing a random selection of the data block from the plurality of data blocks of the memory component.

* * * * *